(12) United States Patent
La Fontaine et al.

(10) Patent No.: US 7,101,645 B1
(45) Date of Patent: Sep. 5, 2006

(54) REFLECTIVE MASK FOR SHORT WAVELENGTH LITHOGRAPHY

(75) Inventors: Bruno La Fontaine, Pleasanton, CA (US); Laurent Dieu, Round Rock, TX (US)

(73) Assignees: Advanced Micro Devices, Inc., Sunnyvale, CA (US); DuPont Photomasks, Inc., Round Rock, TX (US)

(*) Notice: Subject to any disclaimer, the term of this patent is extended or adjusted under 35 U.S.C. 154(b) by 262 days.

(21) Appl. No.: 10/342,500

(22) Filed: Jan. 15, 2003

(51) Int. Cl.
*G03F 9/00* (2006.01)
*G21K 5/00* (2006.01)

(52) U.S. Cl. .......................................... 430/5; 378/35

(58) Field of Classification Search ............. 430/5, 430/394; 378/35; 382/382, 144
See application file for complete search history.

(56) References Cited

U.S. PATENT DOCUMENTS

| 6,098,408 A | 8/2000 | Levinson et al. |
| 6,178,221 B1 | 1/2001 | Levinson et al. |

(Continued)

OTHER PUBLICATIONS

"Application of Reactive Ion Etching to the Fabrication of Microstructure on Mo/Si Multilayer", LE Zi–Chun, L. Dreeskornfeld, S. Rahn, R. Segler, U. Kleineberg and U. Heinzmann, Chin. Phys. Lett., vol. 16, No. 9, 1999, pp. 665–666.

"Soft X–Ray Projection Imaging with Multilayer Reflection Masks", Masaaki Ito, Hiroaki Oizumi, Takashi Soga, Hiromasa Yamanashi, Taro Ogawa, Soichi Katagiri. Eiichi Seya and Eiji Takeda. Elsevier Science B.V.

Mciroelectronic Engineering 27, 1995, pp. 285–290.

"Reactive Ion Etching of Multilayer Mirrors for X–Ray projection Lithography Masks", C. Khan Malek, F. R. Ladan, M. Carre and R. Rivoira, Elsevier Science Publishers B.V., Microelectronic Engineering 13, 1991, pp. 283–286.

"Application of E–Beam Lithography and Reactive Ion Etching to the Fabrication of Masks for Projection X–Ray Lithography", C. Khan Malek, F.R. Ladan, R. Rivoira, and T. Moreno, American Vacuum Society, Nov./Dec., 1991, pp. 3315–3318.

"Reflective Mask Technologies and Imaging Results in Soft X–Ray Projection Lithography", D.M. Tennant, J.E. Bjorkholm, R.M. D'Souza, L. Eichner, R.R. Freeman. J.Z. Pastalan. L.H. Szeto. O.R. Wood II. T.E. Jewell. W.M. Mansfield, W.K. Waskiewiza, D.L. White, D.L. Windt and A.A. MacDowell, American Vacuum Society, Nov./Dec., 1991, pp. 3176–3183.

*Primary Examiner*—S. Rosasco

(57) ABSTRACT

A reflective mask (e.g., an EUV reflective mask) and a method of making such a mask are disclosed. The mask includes an absorbent substrate and a reflective coating overlying the substrate. The reflective coating is patterned to include a circuit design that is to be transferred onto one or more wafers, and more particularly onto one or more die on the wafers, during semiconductor fabrication processing. The mask includes no other radiation absorbent material, and the occurrence and severity of dead zones, which commonly occur in conventional reflective masks and which degrade the fidelity of pattern transfers, are thereby mitigated. A methodology for inspecting the mask via the transmission of visible, UV or deep-UV radiation through the mask is also disclosed.

18 Claims, 10 Drawing Sheets

U.S. PATENT DOCUMENTS

| | | |
|---|---|---|
| 6,356,340 B1 | 3/2002 | Spence |
| 6,410,193 B1 * | 6/2002 | Stivers et al. .................. 430/5 |
| 6,479,195 B1 * | 11/2002 | Kirchauer et al. ............. 430/5 |
| 6,583,068 B1 * | 6/2003 | Yan et al. ................... 438/761 |
| 2003/0123605 A1 | 7/2003 | Rau |
| 2003/0194615 A1 * | 10/2003 | Krauth .......................... 430/5 |
| 2004/0091789 A1 | 5/2004 | Han et al. |
| 2004/0131947 A1 | 7/2004 | Gallagher et al. |

* cited by examiner

REFLECTIVE MASK FOR SHORT WAVELENGTH LITHOGRAPHY

FIELD OF INVENTION

The present invention relates generally to a reflective mask for use in lithography such as extreme-UV (EUV) lithography.

BACKGROUND OF THE INVENTION

In the semiconductor industry, there is a continuing trend toward higher device densities. To achieve these high densities there has been, and continues to be, efforts toward scaling down the device dimensions on semiconductor wafers. In order to accomplish such a high device packing density, smaller features sizes are required. This may include the width and spacing of interconnecting lines and the surface geometry such as the corners and edges of various features.

The requirement of small features with close spacing between adjacent features requires high resolution photolithographic processes. In general, lithography refers to processes for pattern transfer between various media. With regard to semiconductor fabrication, a silicon slice (e.g., a wafer) is coated uniformly with a radiation-sensitive film of material (e.g., a photoresist). The coated substrate can be baked to evaporate solvents in the photoresist composition and to fix the photoresist coating onto the substrate. An exposing source (e.g., light, x-rays, an electron beam) can then be utilized to illuminate selected areas of the surface of the film through an intervening master template (e.g., a mask or reticle) to affect the transfer of a pattern formed within the template onto the wafer. The lithographic coating is generally a radiation-sensitized coating suitable for receiving a projected image of the subject pattern. Once the image from the intervening master template is projected onto the photoresist coating, it is indelibly formed therein.

Light projected onto the photoresist layer during photolithography changes properties (e.g., solubility) of the layer of material such that different portions thereof (e.g., the illuminated or un-illuminated portions, depending upon the type of photoresist utilized) can be manipulated in subsequent processing steps. For example, regions of a negative photoresist become insoluble when illuminated by an exposure source such that the application of a solvent to the photoresist during a subsequent development stage removes only non-illuminated regions of the photoresist. The pattern formed in the negative photoresist layer is, thus, the negative of the pattern defined by opaque regions of the template. By contrast, in a positive photoresist, illuminated regions of the photoresist become soluble and are removed via application of a solvent during development. Thus, the pattern formed in the positive photoresist is a positive image of opaque regions on the template.

Projection lithography is a powerful and important tool for integrated circuit processing. However, as feature sizes continue to decrease, optical systems are approaching their limits caused by the wavelengths of the optical radiation being utilized. A recognized way of further reducing feature sizes is to lithographically image them with radiation of a shorter wavelength. Extreme ultraviolet (EUV) or "soft" x-rays, which have wavelengths within a range of about 30 to 700 Angstroms (i.e., about 3 to 70 nm), can, for example, be considered as an alternative radiation source in photolithography processing in an effort to achieve desired feature sizes.

EUV lithography may be carried-out, for example, in an EUV lithography system, such as that illustrated in prior art FIG. 1. The prior art system 100 depicted in FIG. 1 is designed to delineate a latent image (not shown) of a desired circuit pattern (e.g., having feature dimensions of 0.18 μm and less) onto a wafer 102 by illuminating a reflective mask 104 with EUV radiation and having at least a portion of that radiation reflected onto the wafer (e.g., via a system of mirrors). The portion of the radiation reflected onto the wafer 102 corresponds to the desired circuit pattern that is to be transferred onto the wafer 102. FIG. 1 is a simplified schematic representation of such a system wherein certain components are not specifically shown.

By way of example, EUV radiation 106 having a wavelength of 3 nm to 70 nm, for example, can be generated from a light source 108, such as a synchrotron or a laser plasma source that can include optical filtering elements 110 and a reflective condenser 112. The condenser and filtering elements can collect the EUV radiation and project one or more beams 114 onto the reflective mask 104 through a slit (not shown), for example, having a particular width and length. The reflective mask 104 absorbs some of the EUV radiation 116 and reflects other portions of the EUV radiation 118 corresponding to one or more features or circuit patterns formed on the mask. The reflective system can include, for example, a series of high precision mirrors 120 (e.g., concave and/or convex mirrors) which can cause the radiation to converge and/or diverge in projecting a demagnified or reduced image of the pattern(s) to be transferred onto the resist-coated substrate 102. Typically, the reflective mask 104 and wafer 102 are mounted to stages (not shown) such that a scanner can move the mask 104 and the wafer 102 at respective orientations and speeds relative to one another (e.g., in a step and scan fashion) to effect a desired mask-to-image reduction and to facilitate pattern transfers onto one or more different die on the wafer.

The mask 104 of prior art FIG. 1 is an important component in the EUV lithography system 100. Unlike conventional UV lithography systems which predominately use refractive optics, many EUV lithography systems, such as the system 100 depicted in prior art FIG. 1, utilize reflective optics. The mask 104 is thus a reflective mask that reflects at least some incident EUV radiation to transfer a pattern onto a wafer during a semiconductor fabrication process, as opposed to allowing some of the radiation to pass through selected portions of the mask.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its purpose is merely to present one or more concepts of the invention in a simplified form as a prelude to the more detailed description that is presented later.

According to one or more aspects of the present invention, a reflective mask, for example, an extreme ultraviolet (EUV) reflective mask, that can be utilized to transfer a pattern onto a wafer during a semiconductor fabrication process includes a patterned reflective coating and a substrate over which the reflective coating is formed. The substrate is absorbent to radiation (e.g., EUV radiation) such that radiation incident to the substrate is not reflected substantially therefrom, and the circuit design patterned within the reflective coating is transferred. In one example, the mask does not include other radiation absorbent material (e.g., EUV absorbent material), other than the substrate, and this lack of other absorbent material mitigates the occurrence and severity of dead zones, which commonly occur in conventional masks and which degrade the fidelity of pattern transfers.

In accordance with one or more other aspects of the present invention, a methodology for fabricating a reflective mask includes patterning a masking material, such as a photoresist, and a reflective coating with the patterned masking material serving as a mask for the reflective coating. The reflective coating overlies an absorbent substrate, and as such, there is no need for patterning an absorbent coating spread across the entirety of the mask. Accordingly, the number of fabrication steps is reduced and the process is simplified and made more efficient as compared to conventional reflective mask fabrication processes.

According to other aspects of the present invention, a methodology for inspecting a mask as produced and described herein is disclosed. The methodology provides for a transmissive inspection technique wherein the inspection is facilitated by directing substantially visible, UV or deep-UV radiation at the mask and evaluating the contrast of light that passes through the mask. Unlike conventional reflective masks, which do not permit visible, UV or deep-UV radiation to pass therethrough (due to a necessary reflective layer covering the entirety of the mask), the substrate of the mask described herein allows light to pass therethrough. The contrast between light passing though the substrate and other areas of the mask that do not let visible, UV or deep-UV radiation pass therethrough (e.g., those areas of the mask containing patterned reflective material) can be examined to evaluate the precision with which features are formed on the mask and obtain a quality assessment of the mask.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
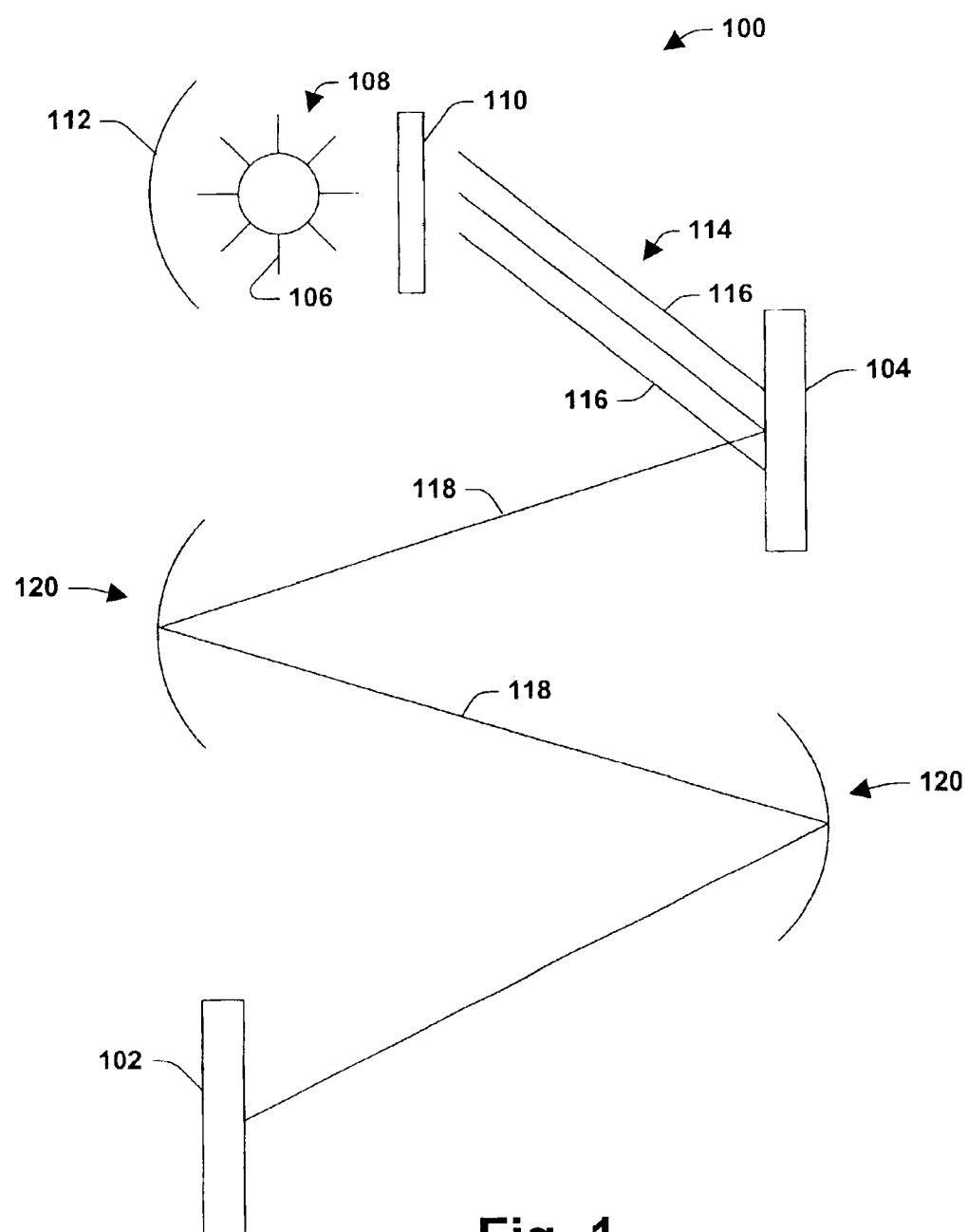
FIG. 1 is a simplified, schematic view of a conventional extreme ultraviolet (EUV) reflective lithography system.

One or more aspects of the present invention arc described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

One or more aspects of the present invention relate to a reflective mask that can be utilized to transfer a pattern onto a wafer during a semiconductor fabrication process, as well as to a methodology for fabricating such a mask. The mask includes a reflective coating and a substrate over which the reflective coating is formed. The reflective coating reflects radiation (e.g., EUV radiation) and is patterned so as to correspond to a desired circuit pattern. Radiation reflected from the mask thus corresponds to a pattern to be transferred onto wafer(s), and more particularly onto one or more die on wafer(s) during a semiconductor fabrication process. The substrate is absorbent to radiation such that incident radiation is not reflected therefrom, and the pattern formed within the reflective coating is transferred onto wafer(s). As will be further appreciated and explained below, the patterning of the reflective coating mitigates the occurrence and severity of dead zones that commonly occur in conventional masks and which degrade the fidelity of pattern transfers.

According to one or more other aspects of the present invention, a methodology for inspecting a mask as produced and described herein is disclosed. The methodology provides for a transmissive inspection technique wherein the inspection is facilitated by directing substantially visible, UV or deep-UV radiation at the mask and evaluating the contrast of light that passes through the mask. Unlike conventional reflective masks, which do not permit visible, UV or deep-UV radiation to pass therethrough (due to a necessary reflective layer covering the entirety of the mask), the substrate of the mask described herein allows light to pass therethrough. The contrast between light passing though the substrate and other areas of the mask that do not let light pass therethrough (e.g., those areas of the mask containing patterned reflective material) is examined to evaluate the precision with which features are formed on the mask.

Note that in the examples described below, an EUV reflective mask is discussed and illustrated, however, the present invention is equally applicable to reflective masks employed over a broad range of wavelengths (e.g., 126 nm), and all such reflective mask structures and methods associated therewith are contemplated as falling within the scope of the present invention.

Figure 2:
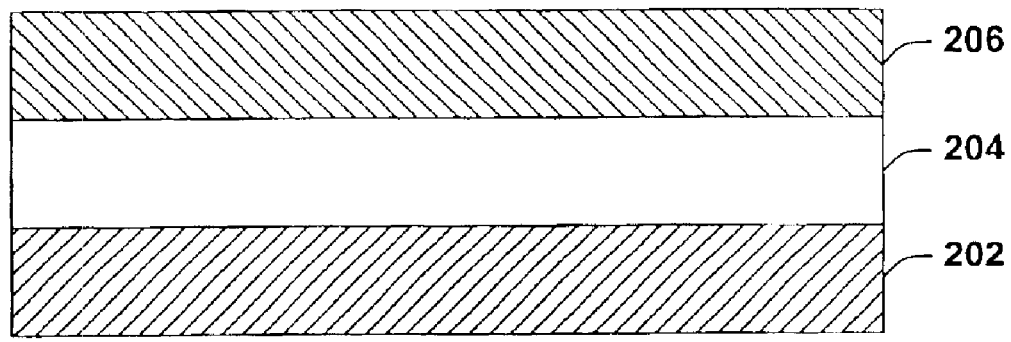
FIGS. 2–6 are cross-sectional illustrations of a conventional EUV. reflective mask depicting the fashioning of the mask out of a reticle blank.

Referring now to the drawings in detail and initially to FIGS. 2–6, in order to appreciate various advantageous features of the present invention, the formation of a conventional reflective mask is described. The mask is fabricated from a reticle blank, an exemplary cross-sectional view of which is depicted in FIG. 2. The blank includes a substrate 202, a reflective coating 204 overlying the substrate 202 and an absorbing coating 206 overlying the reflective coating 204. The substrate 202 generally comprises a low-thermal expansion material (LTEM), and the reflective coating 204 includes a material that reflects extreme ultraviolet (EUV) radiation, while the absorbing coating 206 includes a material that absorbs EUV radiation. The absorbing material can include, for example, any one or more of the following, either alone or in combination: chrome, fused silica ($SiO_2$), silver, tungsten, gold, germanium, tungsten, tantalum, tantalum nitride, titanium, titanium nitride, polyimide and polymethyl methacrylate (PMMA).

Figure 3:
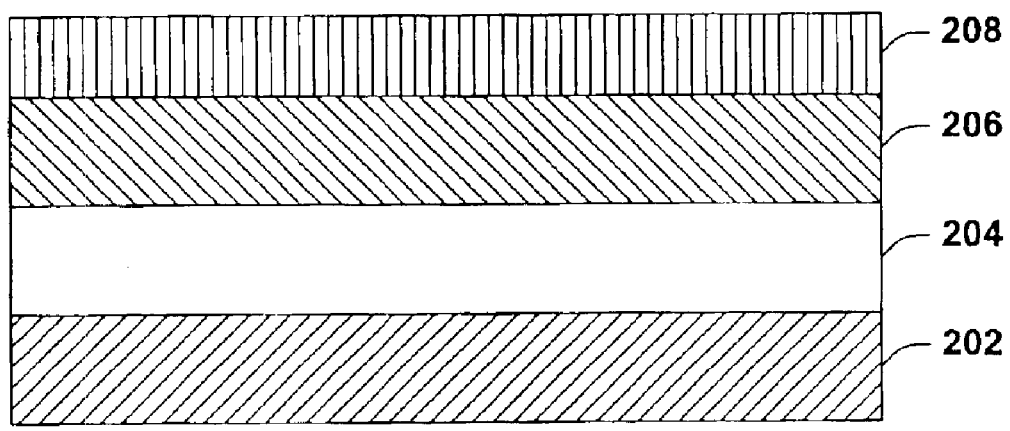
Figure 4:
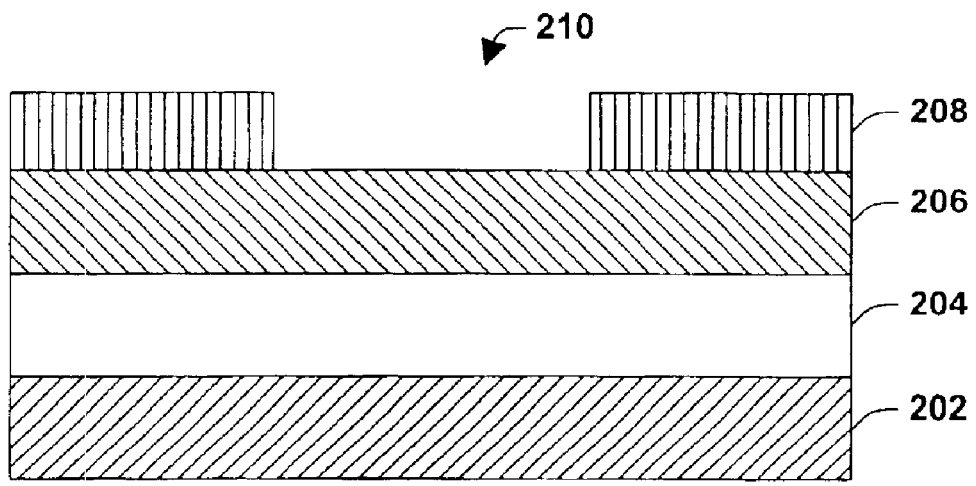

To form the mask from the reticle blank, the surface of the blank (e.g., upper side of the absorbing layer 206) is coated with a photoresist material 208 (FIG. 3). The layer of photoresist material 208 is then processed to form desired patterns therein, such as may include an aperture 210, for example (FIG. 4). The patterns correspond to features of circuit designs which are to be subsequently transferred onto associated wafer(s), and more particularly onto individual die on wafer(s), as part of a semiconductor fabrication process. The photoresist layer 208 can be patterned by selectively exposing it to radiation, which alters one or more of its properties (e.g., solubility) at the selected locations. A solvent can then be applied to the photoresist coating to remove illuminated or un-illuminated portions, depending upon the type of photoresist utilized (e.g., positive or negative).

Figure 5:
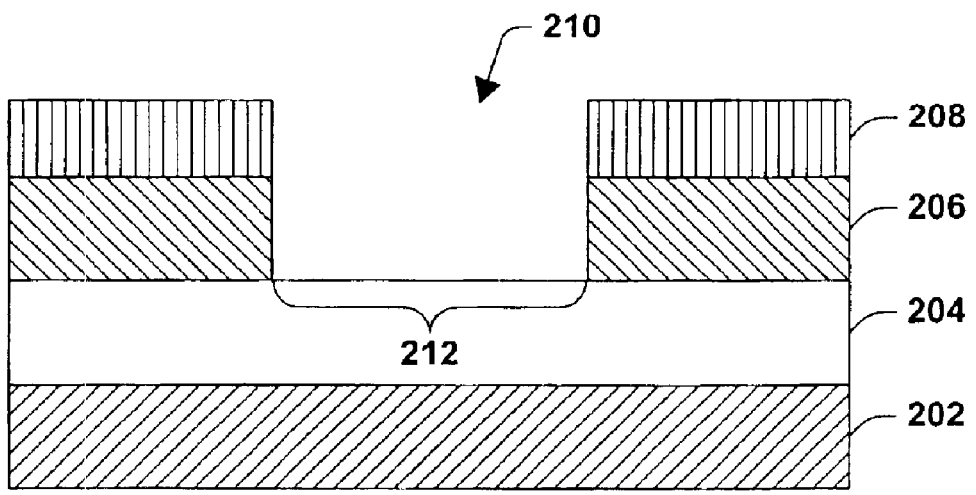

The absorbing layer 206 is then patterned to include the desired features, such as the aperture 210 (FIG. 5). The absorbing layer 206 can be etched, for example, to form the desired features therein, with the photoresist 208 serving as a mask to facilitate the etching process. The portion(s) 212 of the reflective layer 204 exposed from etching the absorbing layer thus correspond to circuit designs that are to be transferred onto die on a wafer in a semiconductor fabrication process. Alternatively, the absorbing layer 206 may be patterned with a writing tool using a molecular beam.

Figure 6:
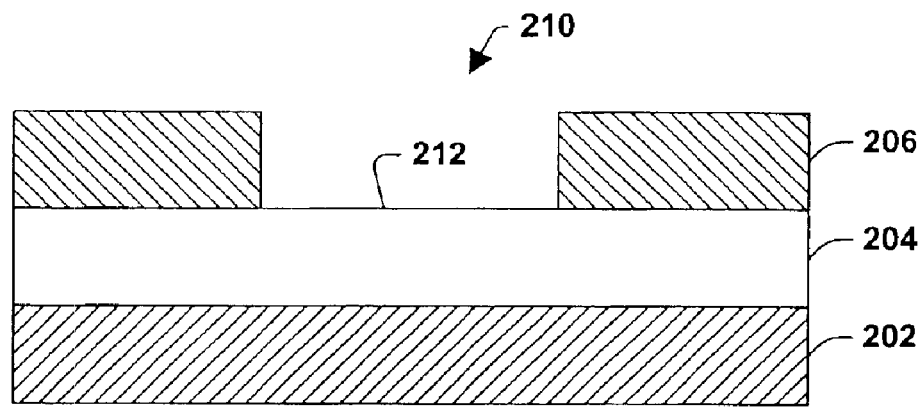
Figure 7:
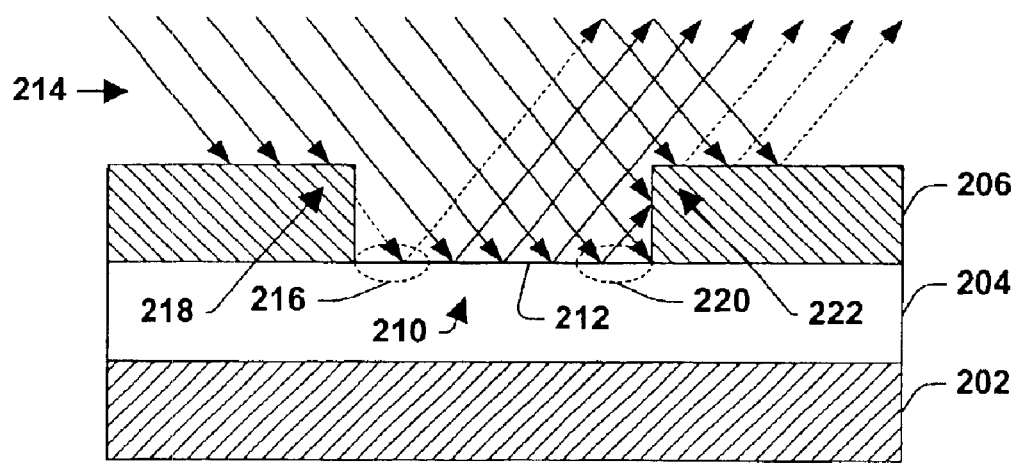
FIG. 7 is a cross-sectional illustration of a conventional EUV reflective mask demonstrating utilization of the mask to reflect EUV radiation.

The remaining photoresist material 208 is then stripped away to yield the usable reflective mask (FIG. 6). EUV radiation 214 directed at the mask is reflected by the exposed portion 212 of the reflective layer 204 and is absorbed by remaining portions of the absorbing layer 206 (FIG. 7). The reflected EUV radiation thus corresponds to a desired circuit pattern and facilitates transferring the pattern onto an associated wafer (e.g., by interacting with an EUV sensitive coating formed on the wafer).

However, because the EUV light incident on the mask impinges the mask at an angle that is off-normal, as can be seen in FIG. 7, not all areas of the exposed portion(s) 212 of the reflective layer receive EUV radiation 214. For example, an area 216 (encircled in phantom) within the aperture 210 is "shadowed" by the surrounding absorbing material 218. The size of this area 216 is a function of the angle of incidence of the EUV radiation 214 as well as the dimensions (e.g., height) and configuration (e.g., a sharp corner) of the surrounding absorbing material 218. The greater the angle of incidence, and the more material 218 surrounding the feature, the larger the area 216 is that is shadowed from EUV radiation 214. Since EUV radiation does not reach this area 216, it is thus not reflected thereby (blocked and un-reflected radiation depicted in phantom), and circuit features corresponding to this area will not be transferred onto associated wafers during semiconductor fabrication. The accuracy of pattern transfers is thereby compromised, and resulting semiconductor devices may perform in manners other than as desired.

Additionally, with conventional masks, other areas of the exposed portions 212 of the reflective layer 204 may also be deficient with regard to providing radiation to associated wafers during semiconductor fabrication processes. However, these areas do not fail to convey EUV radiation because they never receive the radiation (e.g., as with area 216 which experiences shadowing effects), but because the EUV radiation that they receive (and subsequently reflect) is blocked by surrounding absorbing material. For example, a second area 220 (encircled in phantom) of the exposed portion 212 of the reflective material 204 within the aperture 210 receives incident EUV radiation and reflects the radiation. However, the reflected EUV radiation is absorbed by the adjacent absorbing material 222 and does not escape the mask (blocked and un-reflected radiation depicted in phantom). The size of this area 220 is thus a function of the angle of incidence (which usually equals the angle of reflection as the reflective layer is generally smooth and uniform) as well as the dimensions (e.g., height) and configuration (e.g., a sharp corner) of the surrounding material 222. The greater the angle of incidence (and thus the angle of reflection), and the more absorbing material 222 surrounding the feature, the larger the area 220 from which reflected EUV radiation is trapped by the surrounding absorbing material.

The respective sizes of these unproductive areas or dead zones 216, 220 are usually relatively equal as the angle of incidence typically remains constant across the smooth exposed portion 212 of the reflective layer 204 and the dimensions and configurations of the surrounding absorbing material 218, 222 are also generally equal. Regardless of their symmetry, asymmetry and/or dimensions, however, the effects of these areas 216, 220 mitigate and interfere with the success of pattern transfers as the entirety of features are not reflected onto associated wafers either by not receiving and reflecting all of the incident radiation (e.g., as with area 216) or by receiving and reflecting the EUV radiation, but then having some of that radiation blocked by surrounding absorbing material (e.g., as with area 220).

Figure 8:
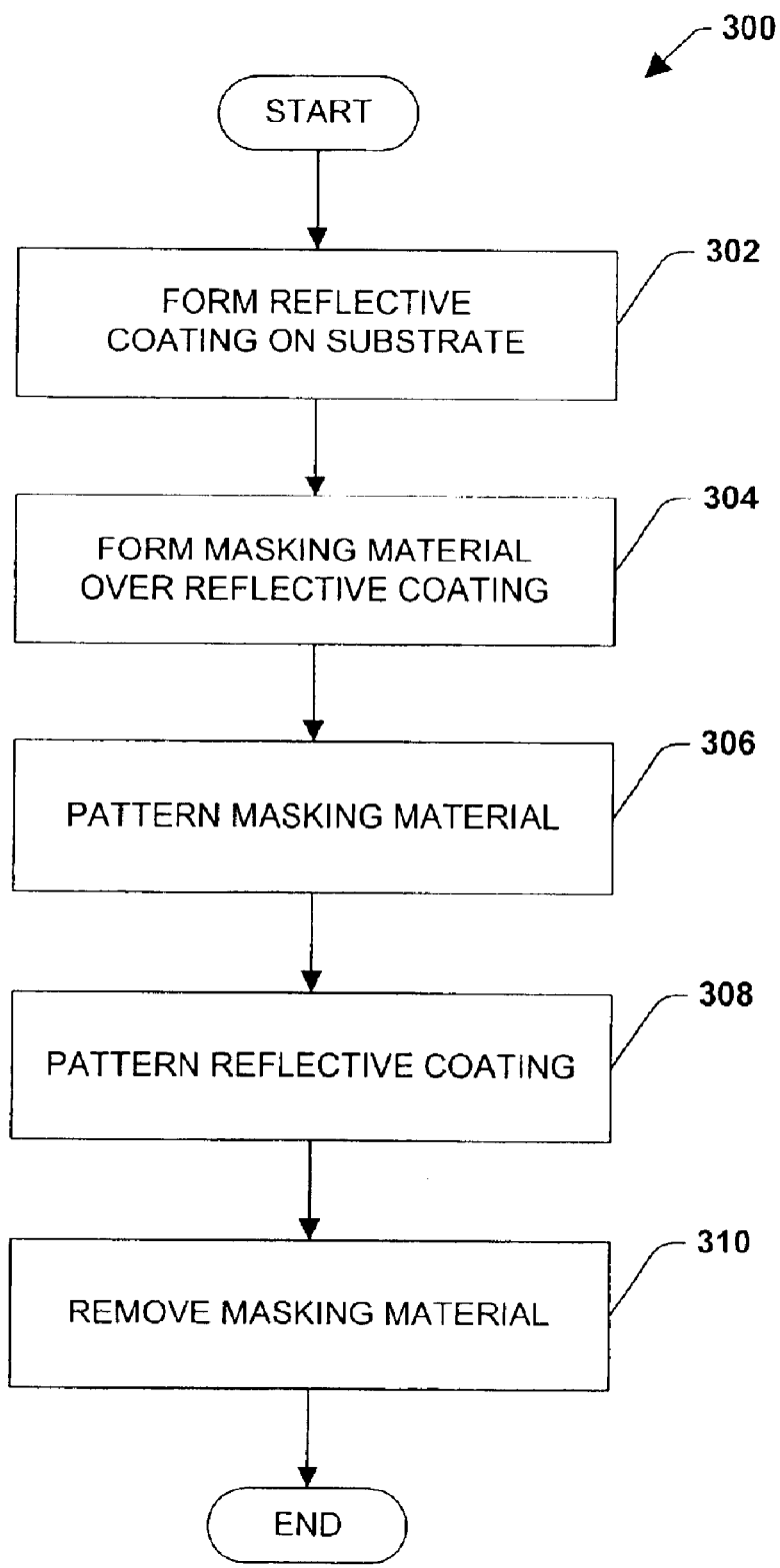
FIG. 8 is a flow diagram illustrating an example of a methodology of fabricating a reflective mask in accordance with one or more aspects of the present invention.

Referring now to FIG. 8, an exemplary methodology 300 is illustrated for fabricating a reflective mask in accordance with one or more aspects of the present invention. Although the methodology 300 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with one or more aspects of the present invention. In addition, not all illustrated steps may be required to implement a methodology in accordance with the present invention. Furthermore, the methodologies according to the present invention may be implemented in association with the formation and/or processing of structures illustrated and described herein as well as in association with other structures not illustrated. In one example, the method or variants thereof, may be used in the fabrication of a reflective mask, as illustrated and described below with respect to FIGS. 9–13.

The methodology begins at 302 wherein a coating of material that is reflective to EUV radiation is applied to a substrate. The substrate can be made of any suitable material, but generally includes a material that has a low coefficient of thermal expansion (e.g., between about 0.25 ppm/° C. and 1.25 ppm/° C.), can be polished to have a substantial uniformity and flatness, is transmissive to substantially visible, UV or deep-UV radiation and absorbs EUV radiation. The substrate can include, for example, a low-thermal expansion material, such as ULE™, Zerodur™, or a mixed glass composition of 92.6 wt. % $SiO_2$ 7.4 wt. % $TiO_2$.

The reflective coating can likewise include any-suitable material, but generally comprises a plurality of overlapping reflective materials (e.g., 40–60 bi-layers) to enhance the EUV reflectivity of the coating. By way of example, layers of any one or more of the following, either alone or in combination, can be utilized to reflect EUV radiation having wavelengths between about 2–25 nm, for example, silicon, molybdenum, beryllium, ruthenium and boron carbide. By way of further example, the reflective coating may include eighty (80) layers of alternating molybdenum and silicon, the respective layers having a thickness within a range of about 1–10 nm.

To mitigate undesired optical performance, the respective layers of reflective material are substantially smooth, uniform and defect free, the transition between the layers is abrupt, and the layer-to-layer thickness variation is maintained within a relatively small range, such as 0.005–0.015 nm, for example. The layers can be formed, for example, via magnetron sputtering, ion beam sputtering, or other techniques to provide high reflectance and establish a high-throughput, cost-effective lithography system (e.g., having an EUV reflection efficiency of about 65% or more). It will be appreciated that the reflective coating can be processed further so as to have additional desired properties.

Proceeding to 304, a masking material is then applied to the reflective coating. The masking material can include, for example, a layer of photoresist material. At 306, the masking material is processed to include a pattern corresponding to an integrated circuit. The masking material can be patterned so as to correspond to the desired circuit layout, for example, by selectively exposing it to radiation, which alters one or more of its properties (e.g., solubility). A solvent can then be applied to the photoresist coating to remove illuminated or un-illuminated portions, depending upon the type of photoresist utilized (e.g., positive or negative).

At 308, the reflective coating is processed to include the integrated circuit pattern formed within the masking material. The integrated circuit pattern can, for example, be etched into the reflective coating with the masking material serving as a guide. It will be appreciated that, after the reflective coating is patterned, the substrate can also be processed (e.g., etched) slightly. This roughens the surface of the substrate making it less reflective to EUV radiation. Finally, at 310, the masking material is removed to reveal the usable mask. The masking material can, for example, be stripped or washed away from the mask. Alternatively, the patterning of the reflective coating at 308 may be performed directly with a writing tool such as a laser, electron beam, etc., without use of a mask, and any manner of patterning the reflective coating is contemplated as falling within the scope of the present invention.

FIGS. 9–17 are cross sectional illustrations of a reflective mask fabricated in accordance with one or more aspects of the present invention. It is to be appreciated that the elements depicted in the figures are illustrated with particular relative dimensions for simplicity and ease of understanding only, and that the actual dimensions of the elements, relative to one another, may differ substantially from that shown therein.

Figure 9:
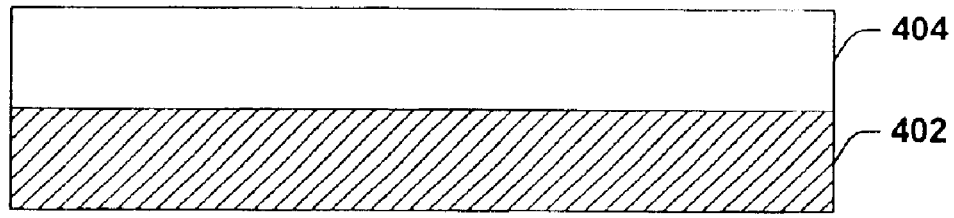
FIGS. 9–13 are cross-sectional illustrations of a reflective mask fashioned in accordance with one or more aspects of the present invention.

Turning to FIG. 9, the formation of the mask begins with a substrate 402 having a reflective coating 404 formed thereover. The substrate 402 can be made of any suitable material, but generally includes a material that is absorbent to EUV radiation, is transmissive to substantially visible, UV or deep-UV radiation, has a low coefficient of thermal expansion (e.g., between about 0.25 ppm°/C. and 1.25 ppm/° C.) and can be polished to have a substantial uniformity and flatness. The substrate can include, for example, a low-thermal expansion material, such as ULE™, or Zeroduor™, or a mixed glass composition of 92.6 wt. % $SiO_2$ 7.4 wt. % $TiO_2$.

The reflective coating 404 can be applied to the substrate 402 in any number of ways, such as with spin-on techniques, sputtering techniques (e.g., magnetron or ion beam sputtering) and growth and/or deposition techniques, for example. The reflective coating 404 can comprise any suitable material, but generally includes a plurality of overlapping reflective materials (e.g., 40–60 bi-layers). The plurality of layers enhances the EUV reflectivity of the coating. By way of example, layers of any one or more of the following, either alone or in combination, can be utilized to comprise the EUV reflective coating 404: silicon, molybdenum, beryllium, ruthenium and boron carbide. Layers of such materials can be utilized to construct a reflective coating that reflects EUV radiation having wavelengths between about 3–70 nm, for example.

By way of further example, the reflective coating may include eighty (80) layers of alternating molybdenum and silicon, where respective layers have thicknesses within a range of about 1–10 nm. The respective layers of reflective material can also have a layer-to-layer thickness variation that is generally maintained within a relatively small range, such as 0.005–0.015 nm, for example. The layers can also be substantially smooth, uniform and defect free, and the transition between the layers can be relatively abrupt. Such characteristics facilitate desired optical performance with the reflective layer and help to establish a high-throughput, cost-effective lithography system (e.g., having an EUV reflection efficiency of about 65% or more). It will be appreciated that the reflective coating 404 can be processed further so as to have additional desired properties.

Figure 10:
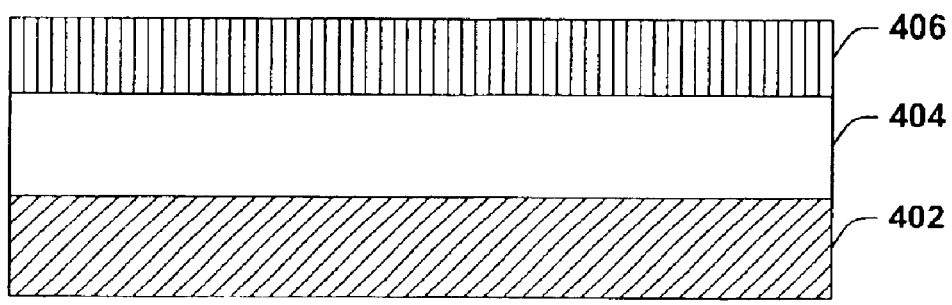
Figure 11:
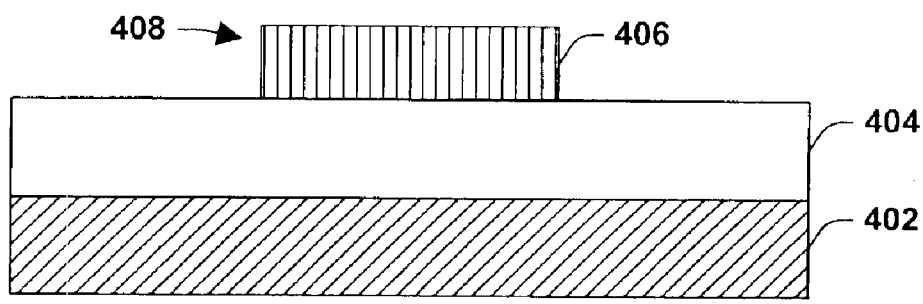

A masking material 406 is then placed over the mask, and more particularly over the reflective coating 404 (FIG. 10). The masking material can include, for example, a layer of photoresist material. The masking material 406 is then processed to include a pattern corresponding to an integrated circuit design, such as may include feature 408 (FIG. 11). It is to be appreciated that while only one feature is depicted in the example illustrated, the mask may comprise any number of features having any number of shapes and sizes to comprise the desired circuit design. The masking material can be patterned, for example, by selectively exposing it to radiation, which alters one or more of its properties (e.g., solubility). A solvent can then be applied to the photoresist coating to remove illuminated or un-illuminated portions of the photoresist, depending upon the type of photoresist utilized (e.g., positive or negative). Alternatively, the radiation can effectively carve out or remove portions of the masking material 406 to generate the pattern therein.

Figure 12:
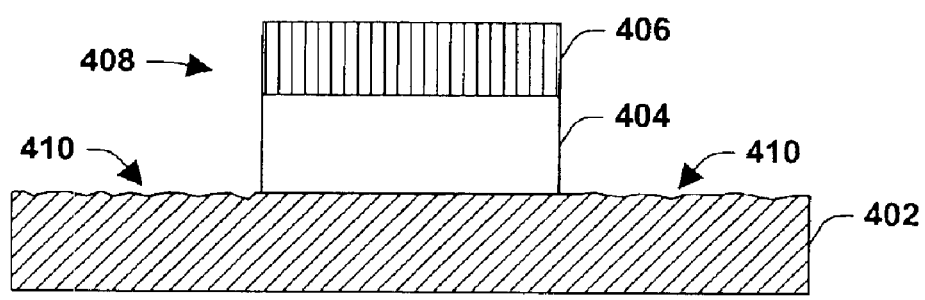

The circuit design formed within the masking material 406 is then transferred into the reflective coating 404 (FIG. 12). The reflective coating 404 can be patterned to include the circuit design in any number of ways, such as via etching, for example, with the masking material 406 serving as a guide. After the reflective coating 404 is patterned, the substrate 402 can also be processed (e.g., etched) slightly to roughen the surface of the substrate 402. The roughened surface 410 of the substrate 402 increases the absorptivity of the substrate 402 with regard to EUV radiation. As such, the mask only reflects the pattern corresponding to the desired circuit design as represented in the patterned reflective layer.

Figure 13:
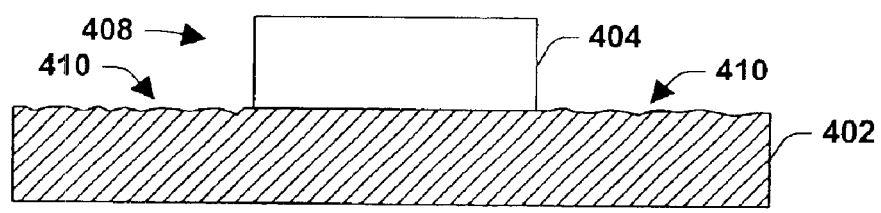
Figure 14:
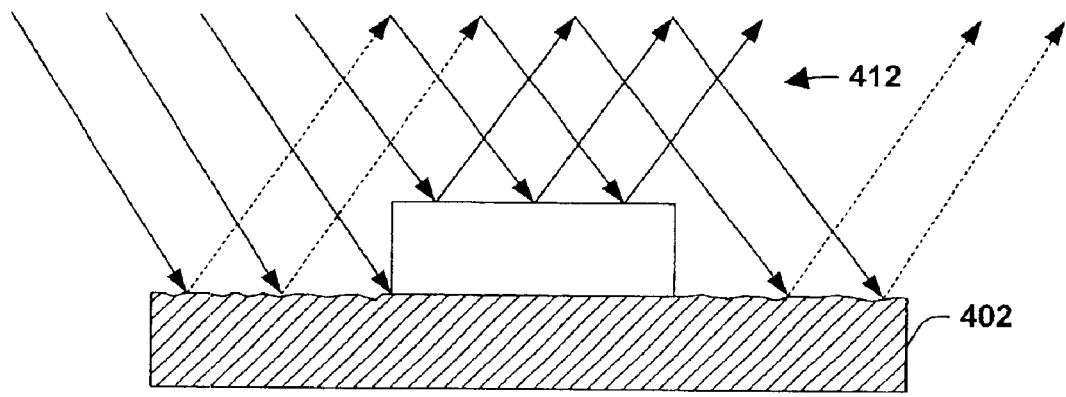
FIG. 14 is a cross-sectional illustration of a reflective mask according to one or more aspects of the present invention and depicts the mask reflecting radiation such as EUV radiation.

The masking material 406 is then removed (e.g., stripped or washed away) to reveal the usable mask (FIG. 13). EUV radiation 412 directed at the mask is reflected by the remaining portions of the patterned reflective layer 404 and is absorbed by the substrate 402 (FIG. 14). The path that radiation directed onto the substrate would take if it were to be reflected by the substrate 402 is depicted for illustrative purposes in phantom (FIG. 14). Accordingly, in contrast to conventional masks (FIG. 7), a mask formed in accordance with one or more of the aspects described herein does not comprise dead zones (e.g., 216, 220 in FIG. 7) as it does not include additional EUV absorbing material which can interfere with transmitting the entirety of design features. Such a mask thus provides improved fidelity as compared to conventional masks.

Figure 15:
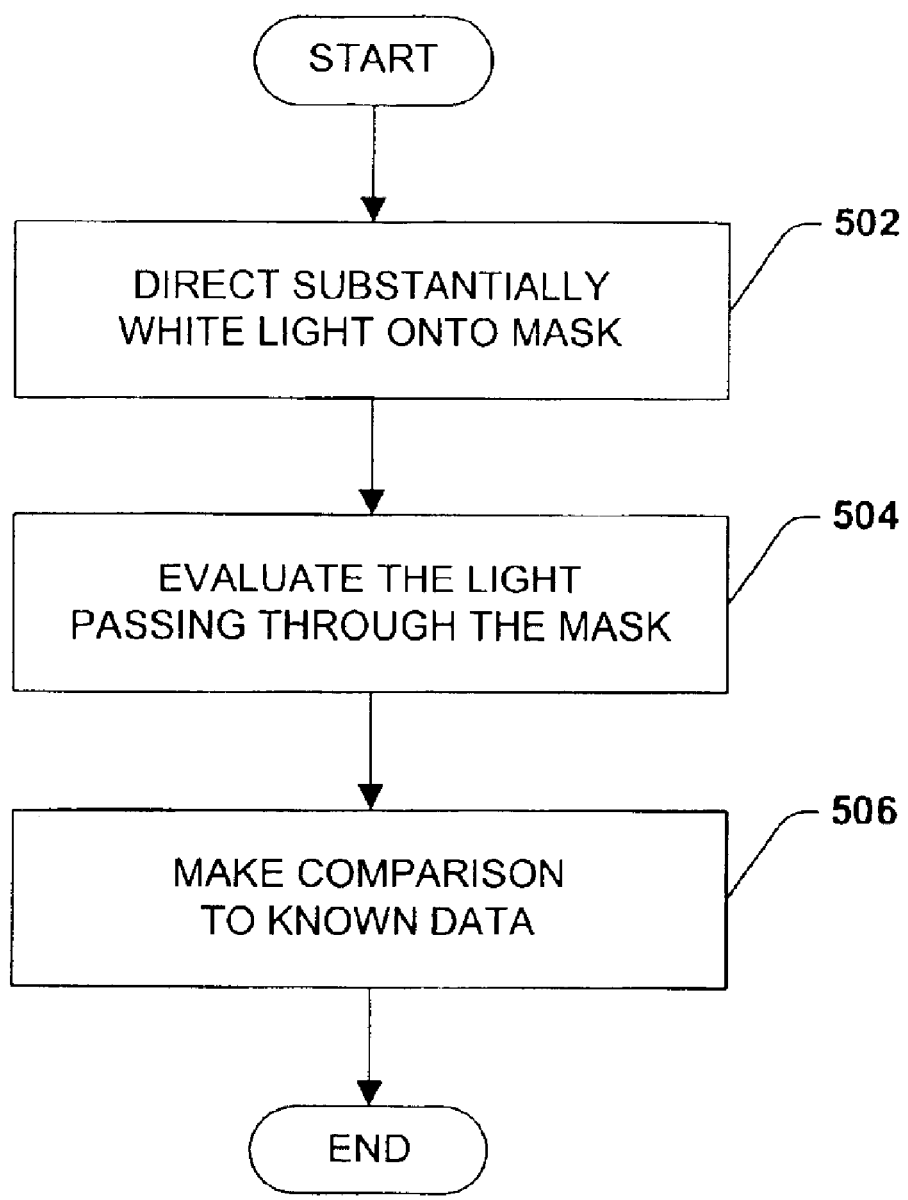
FIG. 15 is a flow diagram illustrating a methodology for inspecting a mask in accordance with one or more aspects of the present invention via transmission of substantially visible, UV or deep-UV radiation through the mask.

Turning to FIG. 15, a methodology for inspecting a mask fashioned in accordance with one or more aspects of the present invention is disclosed. The methodology begins at 502 wherein a substantially visible, UV or deep-UV radiation (e.g., having multiple wavelengths in the visible spectrum or a wavelength within a range of about 0.15–0.9 microns) is directed at the mask. Although the substrate is absorptive as to EUV radiation, it is transmissive as to the visible, UV or deep-UV radiation. The visible, UV or deep-UV radiation, however, can not pass thought the patterned reflective coating on the mask. Accordingly, visible, UV or deep-UV radiation passes through areas of the mask where the reflective coating is absent or has been patterned away. Then, at 504, the light transmitted through the mask is examined for an evaluation of mask quality (e.g., proper location, orientation, configuration/sharpness of features). Light areas appearing on a surface onto which the visible, UV or deep-UV radiation is transmitted after passing through the mask indicate the absence of a feature, while dark areas on the surface reveal the presence of a feature. The contrast between these light and dark areas can be, for example, evaluated to give an indication as to the location of beginning and ending points of features (e.g., edges or sidewalls) as well as to the configuration (e.g., slope) of features. Such information about the features is compared, at 506, to known data regarding intended or desired locations of the features to thereby produce a quality assessment of the mask.

Figure 16:
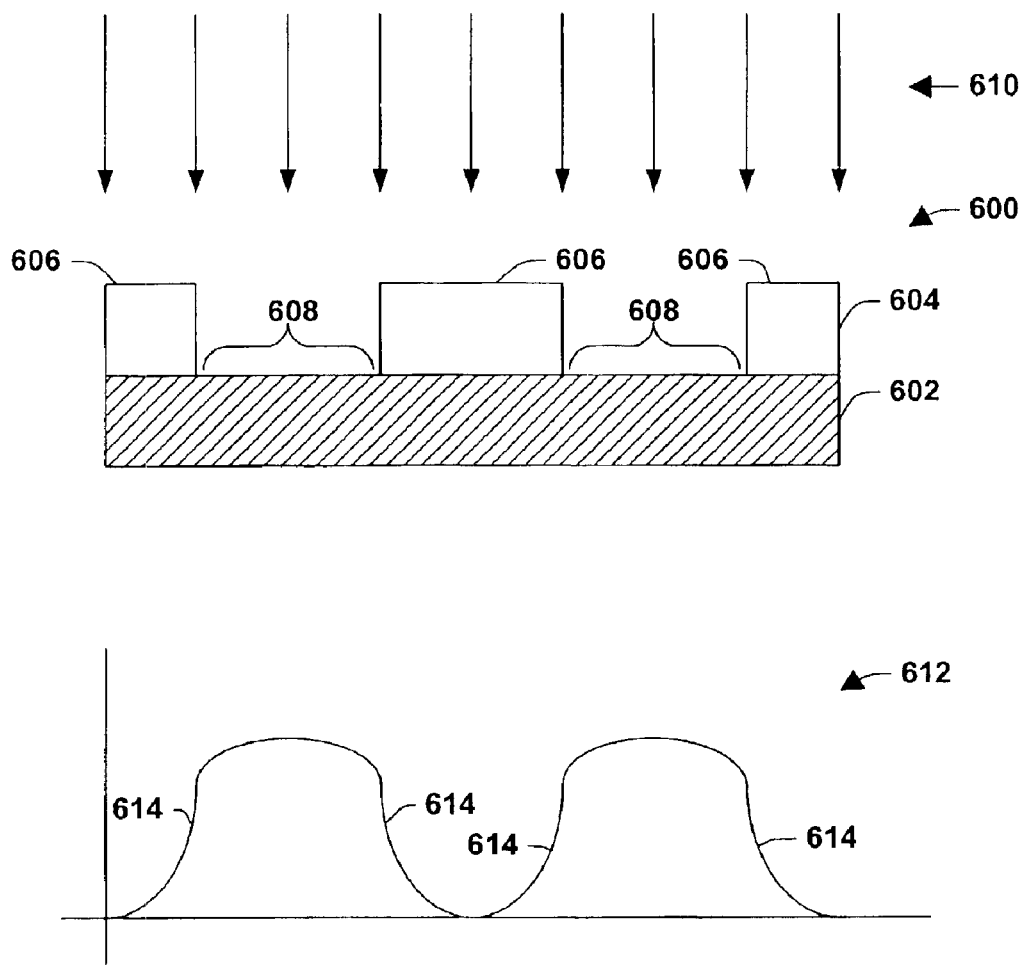
FIG. 16 is a cross-sectional illustration of a reflective mask according to one or more aspects of the present invention and depicts inspecting the mask via transmission of substantially visible, UV or deep-UV radiation through the mask.

Inspection of a mask 600 fashioned in accordance with one or more aspects of the present invention is discussed now with reference to FIG. 16. The mask 600 includes a substrate 602 and a reflective coating 604. The reflective coating 604 has been patterned so as to include one or more features 606 corresponding to a desired circuit design. The features 606 are separated by apertures 608 that have been formed within the reflective coating as a result of the patterning. The substrate 602 is transmissive to visible, UV or deep-UV radiation, while the reflective coating 604 is reflective or absorptive to visible, UV or deep-UV radiation. Thus, when a substantially visible, UV or deep-UV radiation 610 is directed at the mask 600, the light passes through the mask where the apertures 608 are located, but is reflected or absorbed where the features 606 are located.

A graph 612 of intensity (shown on the y-axis) of substantially visible, UV or dee-UV radiation passing through the mask reveals the transmission of visible, UV or deep-UV radiation through the mask. Contrast between light and dark, or light passing and not passing through the mask, occurs at points on the mask where a transition between the absence of a feature and the presence of a feature occurs. These transition points correspond to spots 614 on the curve having a relatively steep slope. As such, the presence or absence of a feature can be ascertained by evaluating the slope of a curve that is indicative of the contrast of substantially visible, UV or deep-UV radiation passing through the mask 600. Evaluating contrast of transmitted visible, UV or deep-UV radiation thus allows the mask to be inspected for accuracy of patterned features. It will be appreciated that conventional EUV reflective masks can not be tested in this fashion as a reflective layer that coats the entirety of the mask (e.g., 204 is FIG. 7) prohibits visible, UV or deep-UV radiation from passing therethrough. As such, less efficient reflective techniques that yield less accurate testing results must be utilized to test conventional EUV reflective masks.

Accordingly, one may now appreciate that one or more aspects of the present to invention provide a reflective lithography mask that mitigates dead zones and enhances the fidelity of pattern transfers by eliminating the need for a patterned absorbing coating to define desired circuit patterns within the mask. Although the invention has been shown and described with respect to one or more implementations, equivalent alterations and modifications will occur to others skilled in the art based upon a reading and understanding of this specification and the annexed drawings. For example, while "visible, UV or deep-UV radiation" or "substantially visible, UV or deep-UV radiation" has been referred to herein as that which is transmissive to the substrate in describing one or more aspects of the present invention, any wavelength that is transmissive with regard to the substrate can be utilized with regard to the present invention, and reference is made to "visible, UV or deep-UV radiation" or "substantially visible, UV or deep-UV radiation" herein for purposes of example only. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A reflective lithography mask comprising:
   a substrate; and
   a reflective coating overlying the substrate that is reflective to radiation and is patterned so as to correspond to a desired circuit layout, wherein the substrate is substantially absorbent to EUV radiation and exposed top surface portions of the substrate not covered by the patterned reflective coating are roughened so as to be more absorbent to EUV radiation.

2. The mask of claim 1, the substrate comprising a low-thermal expansion material or a mixed glass composition of about 92.6 wt. % SiO$_2$ and about 7.4 wt. % TiO$_2$.

3. The mask of claim 1, the reflective coating including at least one of silicon, molybdenum, beryllium, ruthenium and boron carbide.

4. The mask of claim 1, the reflective coating including a plurality of layers of one or more EUV reflective materials.

5. The mask of claim 4, the layers having respective thicknesses within a range of about 1–10 nm.

6. A method of making a reflective lithography mask comprising:

forming a reflective coating that is reflective to lithography radiation on a top surface of a substrate that is substantially absorbent to lithography radiation;

forming a masking material over the reflective material;

patterning the masking material so as to correspond to a desired circuit layout;

patterning the reflective coating so as to correspond to the desired circuit layout with the patterned masking material serving as a mask, where the reflective coating is patterned through so that top surface portions of the substrate are roughened so as to be more absorbent to EUV radiation; and removing the masking material.

7. The method of claim 6 further including depositing a plurality of layers of one or more EUV reflective materials to form the reflective coating.

8. The method of claim 7, the one or more EUV reflective materials including at least one of silicon, molybdenum, beryllium, ruthenium and boron carbide.

9. The method of claim 7, the layers having respective thicknesses within a range of about 1–10 nm.

10. The method of claim 6, the reflective coating including a plurality of layers of one or more EUV reflective materials.

11. The method of claim 6, the one or more EUV reflective materials including at least one of silicon, molybdenum, beryllium, ruthenium and boron carbide.

12. The method of claim 6, the layers having respective thicknesses within a range of about 1–10 nm.

13. The method of claim 6, the reflective coating patterned via etching.

14. The method of claim 6, the substrate comprising a low-thermal expansion material (LTEM) or a mixed glass composition of about 92.6 wt. % SiO2 and about 7.4 wt. % TiO2.

15. The method of claim 6 further comprising:

optically inspecting the mask by directing substantially visible, UV or deep-UV radiation onto the mask and evaluating the light passing through the mask.

16. The method of claim 15, wherein the inspection includes determining a contrast pattern of light passing through the mask.

17. The method of claim 6, the masking material including a photoresist.

18. A method of optically inspecting a mask as described in claim 1 comprising:

directing light having a wavelength of between about 190 and about 90 nanometers on the mask; and evaluating light that passes through the mask.

* * * * *